United States Patent [19]
Cole et al.

[11] Patent Number: 6,046,485
[45] Date of Patent: Apr. 4, 2000

[54] LARGE AREA LOW MASS IR PIXEL HAVING TAILORED CROSS SECTION

[75] Inventors: Barrett E. Cole, Bloomington; Robert E. Higashi, Shorewood, both of Minn.

[73] Assignee: Honeywell International Inc., Minneapolis, Minn.

[21] Appl. No.: 09/283,649

[22] Filed: Apr. 1, 1999

[51] Int. Cl.[7] .......................... H01L 27/14; H01L 31/00; H01L 31/058
[52] U.S. Cl. .................. 257/428; 257/467; 257/536; 257/332; 257/338.4; 257/370.08; 257/370.14
[58] Field of Search ................................. 257/428, 467, 257/536, 537; 250/332, 338.4, 370.08, 370.14, 370.12, 492.2

[56] References Cited

U.S. PATENT DOCUMENTS

| | | |
|---|---|---|
| 5,220,188 | 6/1993 | Higashi et al. .......................... 257/467 |
| 5,286,976 | 2/1994 | Cole . |
| 5,369,280 | 11/1994 | Liddiard . |
| 5,420,419 | 5/1995 | Wood . |
| 5,600,148 | 2/1997 | Cole et al. . |
| 5,675,149 | 10/1997 | Wood et al. . |
| 5,698,852 | 12/1997 | Tanaka et al. . |
| 5,821,598 | 10/1998 | Butler et al. .......................... 257/467 |
| 5,912,464 | 6/1999 | Vilain et al. ......................... 250/338.4 |
| 5,929,441 | 7/1999 | Beratan et al. ...................... 250/338.3 |

*Primary Examiner*—Ngân V. Ngô
*Attorney, Agent, or Firm*—Ian D. Mackinnon

[57] ABSTRACT

The present invention provides a much more optimum design for an infrared pixel microstructure. The configuration of the microstructure itself is designed to optimum operational characteristics including faster speeds than previously available. These faster speeds are achieved by reducing the thermal mass of the pixel itself, thus directly affecting the pixels associated thermal time constant. Thermal mass is reduced by tailoring the cross section of the pixel structure such that protective layers are substantially reduced in areas where they are not necessary. This results in the desired reduction and overall pixel mass and consequently more optimum pixel performance.

13 Claims, 2 Drawing Sheets

LARGE AREA LOW MASS IR PIXEL HAVING TAILORED CROSS SECTION

The Government may have rights in this invention pursuant to Contract No. F08630-96-C-0090, awarded by the Department of the Air Force.

BACKGROUND OF THE INVENTION

The present invention relates to a pixel structure for use in an infrared pixel array. More specifically, the structure of the present invention is used for microemitter or microbolometer applications. In the microemitter application, the pixel of the present invention is used as one portion of a pixel array to perform infrared projection. Alternatively, in the microsensor, or microbolometer applications, the pixel structure of the present invention forms one pixel of a detector array.

Microstructures generally can be used to form various types of sensors and sensor products. In certain applications, these microstructures are arranged in arrays which cause the multiple pixels to cooperate with one another. One well known application is the microemitter, where the pixel array is used to project an image. In another well known application, the pixel array is used as a microbolometer wherein the array is used to detect a two dimensional signal.

In each application, it is essential that the pixels be isolated from one another. This isolation allows each pixel to operate independently from its surroundings pixels, thus creating contrast in either the sensed or displayed image.

In the aforementioned microemitter application, each pixel is independently energized to project a signal. In the case of an IR scene projector, the pixel is energized, causing heating of the element itself resulting in the emission of IR radiation. When arranged in an array of individual pixels and appropriately addressed, this collection of individual emitters can create the desired image.

Similarly, an array of microstructure pixels can be used in the microbolometer application to detect IR radiation or signals. In this application, each individual pixel is sensitive to IR signals. When such IR signals hit the sensing surface or area of the pixel, the resistance of the pixel active element changes. This resistance change can be appropriately sensed by related circuitry and fed back to an image controller. When the signals from an array of pixels are appropriately processed, a digital picture image can be created.

For any of the microstructure devices referenced above (microbolometer or microemitter), the optimum design is influenced by many factors. Due to the practical operational requirements, these considerations are surprisingly complex. More specifically, the optimum design characteristics include large fill factors, high thermal isolation, and an appropriate thermal time constant (speed).

Generally speaking, the time constant is related to the speed of the device. As can be appreciated, in either a detection or projection mode, it is desired that the pixels are updated frequently. This requires that the pixels be able to cycle or regenerate very quickly. In practical applications, it is not unusual to have frame rates existing anywhere from 30 to 500 hertz, thus the appropriate time constant must exist. Generally speaking, the thermal time constant is equal to the thermal mass of the pixel divided by the thermal conductivity. A low thermal time is desired as this will allow for high speed operation.

As mentioned above, large fill factor is an optimum characteristic in the design of microstructure pixels. Fill factor relates to the area used by the active portion of the pixel. It is beneficial for the fill factor to be as high as possible, utilizing the largest potential area of the pixel. This is especially true for emitter applications, where it is desirable to have a large surface of the pixel emitting the desired radiation signals.

Another obvious consideration is thermal isolation. It is clearly necessary that each of the pixels be thermally isolated from one another in order to avoid any cross talk. This allows each pixel to maintain its independence and create a high contrast array.

The ability to distribute and appropriately transmit heat is of the utmost importance in designing the pixel. The ability to dissipate heat when the heated pixel is turned off clearly affects the thermal time constant and speed of the pixel. When designing the microstructure itself, heat dissipation considerations must always be taken into account.

Current microstructures for IR pixels generally can take on several configurations. Each of these configurations however has several consistent features, all related to the manufacturing process. As can be expected, the microstructures used for these infrared pixels are fabricated using thin film processes. Consequently, appropriate films and masks are used in a multi-step process to achieve the appropriate microstructure configuration.

One example of a manufacturing process for creation of these microstructures starts with integrated read out and drive circuitry, previously fabricated on a wafer. This wafer is then finished to have a planar top surface. Next a reflective layer is placed upon this finished top surface. Upon the reflective layer is deposited a sacrificial layer with connection posts at appropriate points to allow communication with the integrated circuit. Upon the sacrificial layer is deposited the actual microstructure itself which includes appropriate layers of resisted material and silicon nitride. When the sacrificial layer is then removed, the microstructure is left, appropriately coupled to the control electronics via connective posts and positioned slightly above the reflective layer. Generally speaking, the active emitter or detector material is encapsulated within an insulating film, such as silicon nitride. This coating provides for mechanical support and chemical passivation. The pixels have a uniform height, generally equal to the height of the silicon nitride layer.

The above-referenced manufacturing process creates pixels of adequate operation, however, their design is not optimized. It is desired to provide the ability to increase the speed at which the pixels can operate without compromising other performance criteria.

SUMMARY OF THE INVENTION

The present invention provides a pixel microstructure design which will further optimize its operational characteristics. In the design of the microstructure, various portions of a silicon nitride protective layer are removed in order to reduce the overall mass of the pixel. Consequently, when viewed in cross section, the overall microstructure no longer has a consistently smooth upper surface, rather, unneeded portions of the protective layers are removed. This removal, drastically affects the thermal mass of the microstructure. As previously mentioned, the time constant is proportional to the thermal mass of the pixel structure. By reducing the thermal mass, the time constant is also reduced. This allows for faster pixel operation, which can then support faster speed arrays.

This modification to the pixel accomplishes the speed objectives, without sacrificing other optimized characteristics of a pixel design. For example, the reduction in cross section can be achieved without affecting the two dimensional layout of a pixel. As this will not effect the resistive heating elements of the pixel, fill factor can remain the same and heat transmission properties can remain similar.

It is an object of the present invention to provide a pixel design which is optimally designed for higher speed operation. This object can typically be achieved by reducing the thermal mass of the pixel itself, consequently similarly affecting the time constant.

It is a further object of the present invention to provide an optimized pixel design which does not sacrifice the fill factor or thermal isolation of a pixel.

BRIEF DESCRIPTION OF THE DRAWINGS

Further objects and advantages of the present invention can be seen by reading the following detailed description and referring to the drawings in which.

DETAILED DESCRIPTION OF THE PREFERRED EMBODIMENTS

The present invention optimizes the pixel design for infrared pixel rays by more appropriately controlling the overall mass or size of the pixel. The mass is controlled by altering the cross section of the pixel. By providing a newly designed pixel structure, the time constant and heating characteristics are appropriately optimized for efficient operation of the pixel itself. This design is particularly appropriate when the pixel is being used as a microemitter. However, advantages can be obtained for microbolometer applications as well.

Figure 1:
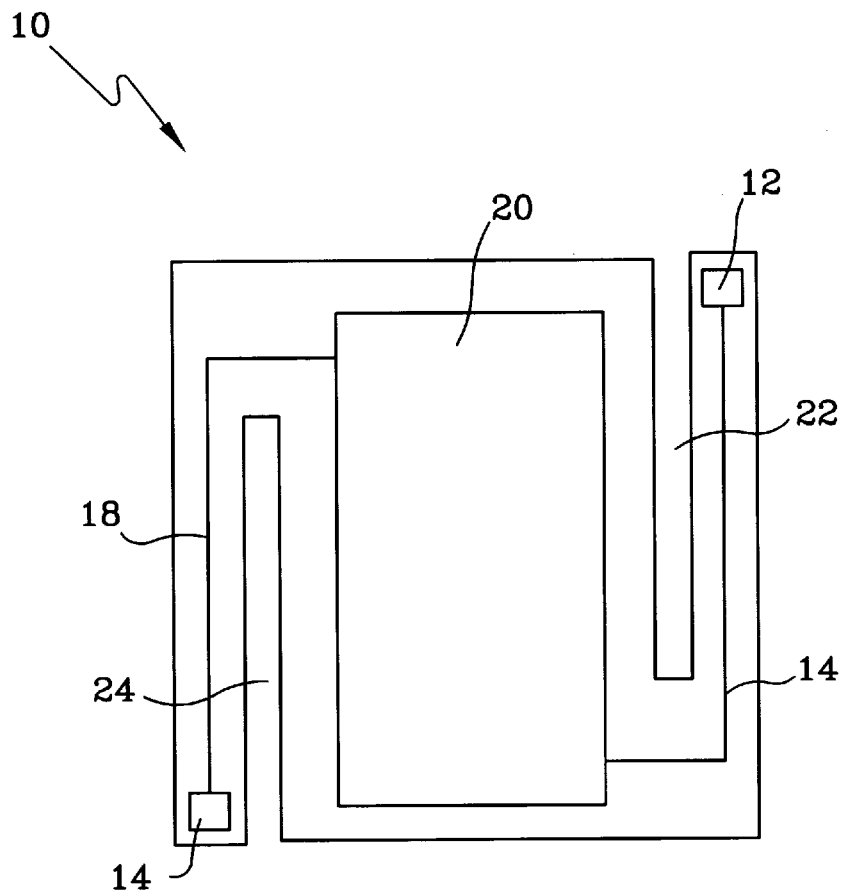
FIG. 1 is a top view of a conceptual pixel of the present invention.
Figure 2:
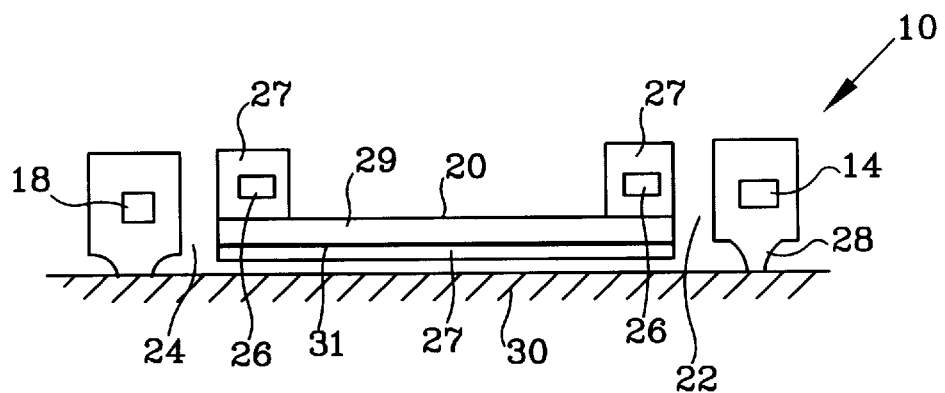
FIG. 2 is a cross-sectional diagram showing detail of cross-section of the present invention.

Referring now to FIGS. 1 and 2 there is shown a conceptual diagram of the microstructure of the present invention. Generally shown is a microstructure pixel 10 which is generally of rectangular shape. At two opposite corners of the microstructure pixel are a first contact 12 and a second contact 14. As is generally understood, first contact 12 and second contact 14 are used to interconnect with appropriate control circuitry. Oftentimes this control circuitry is located above or below the pixel itself. A general description of micromachine pixels as used in infrared applications can be found by referring to B. E. Cole, R. E. Higashi, and R. A. Wood, "Monolith Arrays of Micromachined Pixels for Infrared Applications," Proceedings of the IEEE, Vol. 86, No. 8, pp. 1679–82, which is herein incorporated by reference.

Pixel 10 has a responsive area 20 which is electrically connected to first contact 12 via a resistor path 16. Similarly, responsive area 20 is connected to second contact 14 via a resistive path 18. As will be recognized, responsive area 20 is configured to either emit or detect infrared radiation. Specifically, in an emitter application, current is provided to the responsive area 20 causing responsive area 20 to heat and emit infrared radiation. Conversely, in a detector application responsive area 20 will change its resistance when infrared radiation is encountered. This change in resistance can thus be connected by the associated circuitry and provided to further signal processing systems.

Pixel 10 further has a first cutout region 22 and a second cutout region 24 to provide appropriate pixel isolation. By providing these cutouts, control of all thermal transfer characteristics is easily achieved.

Referring now specifically to FIG. 2, there is shown a cross-sectional diagram of the conceptual pixel of FIG. 1. In typical construction of such pixels, resistive areas 26 are generally deposited and then are completely covered by protective layers 27. Protective layers 27 are typically thin film layers of silicon nitride, or a similar compound. It can be seen by referring to FIG. 2 however, the cross-section of the present pixel is not uniform. More specifically, the portion above responsive region 20 has a reduced cross-section. Such cross-section is created by appropriate thin film processing techniques such as masking, etc.

This cross-sectional reduction above the active area reduces the overall mass of the pixel itself, having a positive effect on the pixel's operational characteristics. More specifically, the reduction in mass directly affects the time constant of the pixel. The time constant is proportionally related to the thermal mass divided by the thermal conductivity of the pixel, this reduction in mass has a direct reduction in the thermal time constant. The time constant is inversely proportional to the pixel speed capabilities. Consequently, a reduction in time constant translates into a higher speed pixel. Further, the design of the pixel shown in FIGS. 1 and 2 does not in any way compromise the fill factor of the pixel or its optional properties since the IR properties are defined by an absorber layer 29 and a reflector 30. As will be appreciated, the reflective layer may typically consist of a thin metal film such as Pt or Au. Similarly, absorber layer 29 may be fabricated of a thin layer of nickel iron alloy, often called a permalloy. Further discussion regarding optimum configuration and designs for absorber layer 29 and reflector 30 is contained in U.S. Pat. No. 5,286,976 entitled Microstructure Design for High IR Sensitivity, which is assigned to the assignee of the present invention and is hereby incorporated by reference. Similar discussion of microstructure configuration for scene projectors can be found by referring to U.S. Pat. No. 5,600,148 entitled Low Power Infrared Scene Projector Array and Method of Manufacture, which is also assigned to assignee of the present invention and is hereby incorporated by reference. As can be seen in FIGS. 1 and 2, no surface area of the pixel is removed or reduced, leaving the active area of the pixel the same size.

Also shown in FIG. 2 are related structures which assist the operation of the pixel, especially when used as an emitter. As previously mentioned, each pixel is connected to associated control circuitry. This connection is made by having first contact 12 and second contact 14 be connected to supporting elements 28. Supporting elements 28 cause the contacts to stand off a substrate or underlying structure. Within supporting elements 28 are the necessary elements to electrically connect to integrated circuits which are fabricated on a surface below the pixel microstructure 10. This connection structure is commonly referred to as a via which is well understood in the art. Typically coated above the integrated circuits is a reflective coating 30. This reflective coating helps to create a quarter wave resonant cavity beneath the pixel microstructure 10.

Responsive area 20, existing between the resistor paths 26 has a much lower cross sectional height as shown in FIG. 2. The actual structure of this area includes an absorber layer 29 which is situated on top of a structure layer 31. This absorber layer for example could be made of a small thickness of nickel chromium. The structure layer 31 however is typically silicon nitrite or some similar material. Observer layer 29 is electrically isolated from the resistive paths for responsive areas.

Figure 3:
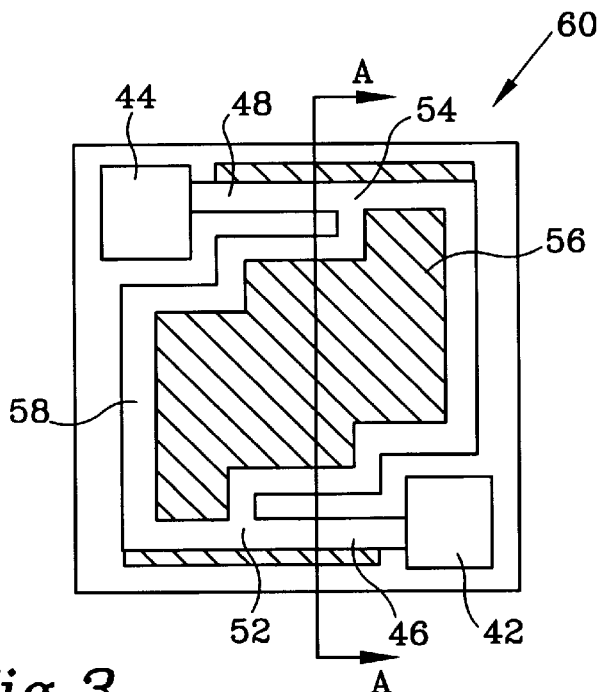
FIG. 3 is a top view of one pixel design according to the present invention.
Figure 4:
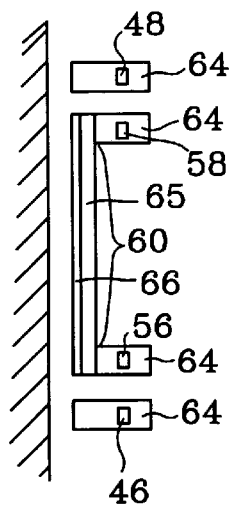
FIG. 4 is a cross-sectional diagram of the pixel FIG. 1 shown at cross section A—A.

Referring now to FIGS. 3 and 4 there is shown an alternate embodiment of the present invention. In FIG. 3, there is shown pixel 10 again having a first contact 42 and a second contact 44. Attached to each of first contact 42 and second contact 44 is a first resister leg 46 and a second resistor leg 48 respectively. Each of these resistor legs, 46 and 48, are connected to first contact point 52 and second contact point 54. Connected between first contact point 52 and second contact point 54 are two parallel resistive paths. More specifically, first resistive path 56 progresses from first contact point 52 to second contact point 54 along the right-hand side of the pixel shown in FIG. 3. Similarly, second resistive path 58 extends from first contact point 52 to second contact point 54 along the left-hand side of the pixel of FIG. 3. Each of these resistive paths create heating structures such that are heated by applying electrical current. This generation of heat is then transmitted to responsive area 60 which is surrounded by first resistive path 56 and second resistive path 58. Heating of these resistive paths also creates heating of the responsive area 60, and in the case of the microemitter the emission of infrared signals.

Referring now specifically to FIG. 4, where the cross-section along A—A is shown. The resistive material making up first resistive leg 46, second resistive leg 48, first resistive path 56 and second resistive path 58 can be seen. As also can be seen, immediately above these resistive paths are significant protective layers 64. As mentioned, protective layers 64 are typically made out of silicon nitride or some other appropriate material. As similar to the conceptual pixel shown in FIGS. 1 and 2, the pixel of FIG. 4 includes an absorber layer 65 and a structure layer 66. In responsive area 60, the only structure remaining are the absorber layer 65 and the structure layer 66. Again, absorber layer 65 is typically a thin layer of nickel chromium or some similar material whereas the structure layer is typically silicon nitrite. Again, the absorber layer is electrically isolated from the remaining conductors in the pixel, however, helps define the optical properties of the pixel. Above responsive area 60, there currently exists no protective material as this is not necessary. The elimination of the protective layer at this point helps to reduce the overall mass of the pixel itself. It will be appreciated, that a thin protective layer could be included above the responsive area 60.

The above-referenced figures show a couple potential embodiments of the present invention. It will be understood that various configurations of the actual resistive pathway outs could be utilized while also exploiting the advantages of the present invention. It will be appreciated that the actual heating of the active area is responsible for creation of infrared signals. As such, resistive material is not required at this point.

Figure 5:
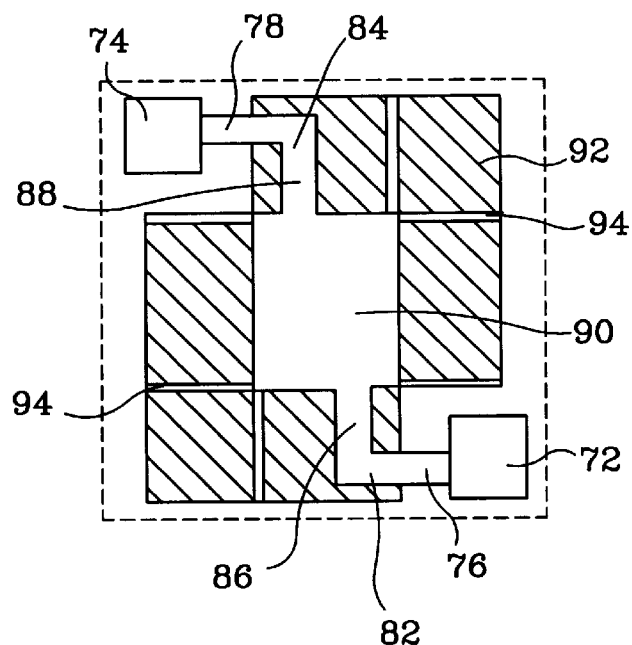
FIG. 5 is a top view of an alternative pixel design according to the present invention.

FIG. 5 displays one possible alternative pixel configuration. The pixel of FIG. 5 includes a first contact 72 and a second contact 74 at opposite corners. Attached to each of these contacts is a first resistor leg 76 and a second resistor leg 78. First, resistor leg 76 extends to a first common point 82 while second resistor leg 78 extends to a second common point 84. Each of these structures is substantially similar to that described in relation to FIG. 3 above.

Although configured slightly differently, a resistor path is created between first common point 82 and second common point 84. This resistor path consists primarily of a first resistor lead 86 and a second resistor lead 88 each of which are connected to a central resistor pad 90. Surround resistor pad 90 are a plurality of responsive areas 92. As will be appreciated, each of these additional responsive areas 92 are somewhat cantilevered away from the central resistor. In order to strengthen the structure, several reinforcement bars 94 have been incorporated into the design. It will be appreciated that the resistive paths and the central resistive pad will be fully covered by a full height protective layer of silicon nitride whereas the areas above responsive areas 92 will be of a reduced height. Reinforcement bars being of full height silicon nitride material help to strengthen the overall structure. Again, this approach helps to minimize the overall mass of the pixel.

Those skilled in the art will further appreciate that the present invention may be embodied in other specific forms without departing from the spirit or central attributes thereof. In that the foregoing description of the present invention discloses only exemplary embodiments thereof, it is to be understood that other variations are contemplated as being within the scope of the present invention. Accordingly, the present invention is not limited in the particular embodiments which have been described in detail therein. Rather, reference should be made to the appended claims as indicative of the scope and content of the present invention.

What is claimed is:

1. A microstructure for use as a pixel in a pixel array, comprising:

a plurality of connection pads structurally connected to a substrate, the connection pads further providing electrical connection to a pixel control circuit on the substrate;

a support structure structurally and electrically attached to the plurality of connection pads and extending from the connection pads, the support structure situated above the substrate and having a predetermined cross-sectional height;

a thermally isolated area structurally and electrically attached to the support structure, the thermally isolated area also situated above the substrate and having the predetermined cross-sectional height; and a responsive area attached to the thermally isolated area and substantially filling the remainder of the pixel area, the fill area having a reduced cross-sectional height, wherein the reduced cross-sectional height is less than the predetermined cross-sectional height.

2. The microstructure of claim 1 wherein the responsive area is surrounded by the thermally isolated area.

3. The microstructure of claim 1 wherein the responsive area extends outwardly from the thermally isolated area.

4. The microstructure of claim 1 wherein the plurality of connector pads includes a first connector pad and a second connector pad.

5. The microstructure of claim 4 wherein the support structure includes a first imbedded electrical connector path connected to the first connector pad and a second imbedded electrical connector path connected to the second connector pad.

6. The microstructure of claim 5 wherein the thermally isolated area includes a resistive path extending between the first connector path and the second connector path.

7. The microstructure of claim 1 wherein the pixel is a microbolometer.

8. The microstructure of claim 1 wherein the pixel is a microemitter.

9. A microstructure pixel for use in a pixel array, comprising:
- a first connection pad and an second connection pad, each connection pad electrically connectable to a pixel control circuit;
- a first resistor leg attached to the first connection pad and extending to a first predetermined location within the pixel, the first resistor leg having a predetermined resistor height
- a second resistor leg attached to the second connection pad and extending to a second predetermined location within the pixel, the second resistor leg also being of the predetermined resistor height;
- a resistor path attached to the first resistor leg at the first predetermined location and attached to the second resistor leg at the second predetermined location, the resistor path extending between the first predetermined location and the second predetermined location, the resistor path also being of the predetermined resistor height; and
- a reduced height responsive region filling substantially the remainder of the pixel, the reduced height responsive region having a predetermined second height, the predetermined second height being less than the predetermined resistor height.

10. The microstructure pixel of claim 9 wherein the reduced height responsive region is surrounded by the resistor path.

11. The microstructure pixel of claim 9 wherein the pixel is a microbolometer.

12. The microstructure pixel of claim 9 wherein the pixel is a microemitter.

13. The microstructure pixel of claim 9 wherein the reduced height responsive region extends outwardly from the resistor path.

* * * * *